United States Patent
McQuilkin et al.

(10) Patent No.: US 11,637,551 B2
(45) Date of Patent: Apr. 25, 2023

(54) COMPARATOR WITH CONFIGURABLE OPERATING MODES

(71) Applicant: Analog Devices, Inc., Wilmington, MA (US)

(72) Inventors: Christopher C. McQuilkin, Hollis, NH (US); Andrew Nathan Mort, Wexford, PA (US)

(73) Assignee: Analog Devices, Inc., Wilmington, MA (US)

( * ) Notice: Subject to any disclaimer, the term of this patent is extended or adjusted under 35 U.S.C. 154(b) by 0 days.

(21) Appl. No.: 17/461,634

(22) Filed: Aug. 30, 2021

(65) Prior Publication Data
US 2021/0391854 A1   Dec. 16, 2021

Related U.S. Application Data

(62) Division of application No. 16/827,168, filed on Mar. 23, 2020, now Pat. No. 11,128,287.

(51) Int. Cl.
*H03K 5/24* (2006.01)
*H03K 5/01* (2006.01)
(Continued)

(52) U.S. Cl.
CPC ........... *H03K 5/24* (2013.01); *G01R 19/0038* (2013.01); *G11C 7/062* (2013.01); *H03K 5/01* (2013.01); *H03K 5/023* (2013.01); *H03K 5/2481* (2013.01)

(58) Field of Classification Search
CPC .......... H03K 5/24; H03K 5/01; H03K 5/2418; H03K 5/2445; H03K 5/2472;
(Continued)

(56) References Cited

U.S. PATENT DOCUMENTS 6,026,288 A   2/2000 Bronner
7,466,258 B1  12/2008 Akopyan et al.
(Continued)

FOREIGN PATENT DOCUMENTS

CN    1996752 A     7/2007
CN   102769447 A   11/2012
(Continued)

OTHER PUBLICATIONS

"U.S. Appl. No. 16/827,168, Ex Parte Quayle Action mailed Mar. 15, 2021", 5 pgs.
(Continued)

*Primary Examiner* — Jung Kim
(74) *Attorney, Agent, or Firm* — Schwegman Lundberg & Woessner, P.A.

(57) ABSTRACT

A multiple operating-mode comparator system can be useful for high bandwidth and low power automated testing. The system can include a gain stage configured to drive a high impedance input of a comparator output stage, wherein the gain stage includes a differential switching stage coupled to an adjustable impedance circuit, and an impedance magnitude characteristic of the adjustable impedance circuit corresponds to a bandwidth characteristic of the gain stage. The comparator output stage can include a buffer circuit coupled to a low impedance comparator output node. The buffer circuit can provide a reference voltage for a switched output signal at the output node in a higher speed mode, and the buffer circuit can provide the switched output signal at the output node in a lower power mode.

15 Claims, 6 Drawing Sheets

(51) Int. Cl.
  G01R 19/00 (2006.01)
  G11C 7/06 (2006.01)
  H03K 5/02 (2006.01)

(58) Field of Classification Search
  CPC ...... H03K 5/2481; H03K 5/023; G11C 7/062; G11C 2029/5602; G11C 29/56012; G11C 29/56016; G01R 19/0038; G01R 31/31924; G01R 31/2834; G01R 31/31932
  See application file for complete search history.

(56) References Cited

U.S. PATENT DOCUMENTS

| | | | |
|---|---|---|---|
| 7,498,851 | B2 | 3/2009 | Maone |
| 7,656,199 | B2 | 2/2010 | Ho |
| 8,183,893 | B2 | 5/2012 | Kojima |
| 8,482,317 | B2 | 7/2013 | Ivanov et al. |
| 8,575,968 | B2 | 11/2013 | Cyrusian |
| 8,760,217 | B2 | 6/2014 | Chua-eoan et al. |
| 9,813,056 | B2 | 11/2017 | McQuilkin |
| 10,193,552 | B1 | 1/2019 | Ji et al. |
| 11,128,287 | B1 | 9/2021 | Mcquilkin et al. |
| 2009/0066372 | A1* | 3/2009 | La Placa .......... H03K 19/09429 327/108 |
| 2018/0254779 | A1 | 9/2018 | Omran et al. |
| 2019/0277891 | A1 | 9/2019 | Peng et al. |
| 2021/0297069 | A1 | 9/2021 | Mcquilkin et al. |

FOREIGN PATENT DOCUMENTS

| | | |
|---|---|---|
| JP | H01185006 | 7/1989 |
| JP | H11145737 | 5/1999 |
| JP | H11281711 | 10/1999 |
| JP | 2006025260 | 1/2006 |
| JP | 4095408 | 3/2008 |
| KR | 20110118245 A | 10/2011 |

OTHER PUBLICATIONS

"U.S. Appl. No. 16/827,168, Examiner Interview Summary dated May 14, 2021", 2 pgs.
"U.S. Appl. No. 16/827,168, Notice of Allowance dated Jun. 23, 2021", 8 pgs.
"U.S. Appl. No. 16/827,168, Response filed Mar. 1, 2021 to Restriction Requirement dated Dec. 28, 2020", 9 pgs.
"U.S. Appl. No. 16/827,168, Response filed May 12, 2021 to Ex Parte Quayle Action dated Mar. 15, 2021", 9 pgs.
"U.S. Appl. No. 16/827,168, Restriction Requirement dated Dec. 28, 2020", 9 pgs.
Zjajo, Amir, et al., "Low-Power High-Resolution Analog to Digital Converters: Design, Test and Calibration", Springer Science and Business Media, (2011), 315 pgs.
"German Application Serial No. 102021106859.2, Office Action dated Nov. 22, 2021", w/English Machine Translation, 12 pgs.
"German Application Serial No. 102021106859.2, Response filed Mar. 18, 2022 to Office Action dated Nov. 22, 2021", 71 pgs.
"Japanese Application Serial No. 2021-48651, Notification of Reasons for Refusal dated Feb. 6, 2023", w/ English Translation, 4 pgs.

* cited by examiner

COMPARATOR WITH CONFIGURABLE OPERATING MODES

CLAIM OF PRIORITY

This divisional application claims priority to U.S. application Ser. No. 16/827,168, filed Mar. 23, 2020, now U.S. Pat. No. 11,128,287 issued on Sep. 21, 2021, which is hereby incorporated by reference herein in its entirety.

BACKGROUND

A test system for electronic device testing can include a pin driver circuit that provides a voltage test pulse to a device under test (DUT). In response, the test system can be configured to measure a response from a DUT, such as to determine whether the DUT meets one or more specified operating parameters. A test system can optionally include multiple driver circuits, such as a class AB driver circuit and a class A driver circuit to provide circuit test signals having different amplitude or timing characteristics. In an example, the test system is configured to measure a response from a DUT using an active load and a comparator circuit to sense transitions at a DUT pin.

A system for testing digital integrated circuits (ICs) can include a driver circuit configured to provide multiple voltage levels (e.g., Vhigh, Vlow and Vterm) to a DUT. The DUT can exhibit bidirectional (I/O) capability in that it can both source and receive stimulus. The driver circuit's Vhigh and Vlow levels serve to stimulate a DUT while in its "input" state, and Vterm acts as a termination for the DUT in its "output" state. The process of switching between Vhigh, Vlow, and Vterm can be conceptualized as a collection of three switches, with one terminal of each switch connected to either Vhigh, Vlow, or Vterm, and the other terminal connected to a common 50 ohm resistor, which is then connected to the DUT node. Transitions between the three levels can be realized by opening and closing the appropriate switches, such as with only one switch closed at any given time.

Various comparator circuit structures have been proposed. Some have enhanced latching accuracy or enhanced bandwidth capabilities for operations such as high-speed sampling in applications such as analog-to-digital converters or automated test equipment (ATE). In an example, a comparator circuit includes an AC input node, a DC input node, and an output node. In an example that includes a comparator in a circuit configured to execute automated testing of a DUT, the AC input node can be coupled to a DUT interface node, and the DC input node can be coupled to a reference node to receive a reference voltage signal. Signal changes at the output node of the comparator circuit can provide information about a relationship between the DUT output and the reference voltage signal.

SUMMARY OF THE DISCLOSURE

The present inventor has recognized, among other things, that a problem to be solved includes providing an automated test system to measure response signals from a device under test (DUT). The problem can include providing a system that is relatively small, inexpensive to produce, consumes less power than traditional systems, or provides higher fidelity performance relative to traditional systems. In an example, the problem can include providing a system with a comparator having a gain stage that provides a substantially constant gain in different low power and high speed test modes. In an example, the problem can include providing a system with a comparator having an output stage that can accommodate multiple test modes, such as relatively low power and relatively high speed test modes. That is, the problem can include providing a comparator portion of a test head wherein output pins of the comparator portion can be shared in different operating test modes.

In an example, a solution to these and other problems can include or use a comparator circuit or comparator stage of an automated test equipment (ATE) system. The comparator can be a multiple-speed or multiple-mode comparator. In one mode, referred to herein as a first operating mode, the comparator can be configured to consume relatively little power at the expense of decreased bandwidth or speed. In a different mode, referred to herein as a second operating mode, the comparator can be configured to operate a relatively higher speed or higher bandwidth, such as at the expense of increased power consumption. The multiple-mode comparator system can thus be useful in high speed testing applications and in low power testing applications.

In an example, the solution can include or use a comparator gain stage that is configured to maintain a specified gain characteristic in high and low speed, or high and low bandwidth, applications. That is, the gain stage can be configured to reduce a total power consumption characteristic of the system particularly for lower speed applications. In an example, the solution can include or use a comparator output stage that is configured for lower power consumption in lower bandwidth applications and is configured for greater speed in other applications. In an example, the solution can include an output stage with a combined or shared output, such that high and low speed output portions can share the same system output pins.

In an example, a solution to the above-mentioned problems can include or use a multi-mode comparator system that is operable in a lower power first mode or a higher speed second mode. The comparator system can include a gain circuit and an output stage. In an example, the gain circuit can include an input switching stage coupled to an adjustable impedance device. An impedance magnitude of the impedance device can be configured to influence a bandwidth characteristic of the gain circuit, and the gain circuit can be configured to provide a gain stage output signal. The output stage can be configured to receive the gain stage output signal and, in response, provide a drive signal at an output node. In an example, the output stage includes a buffer circuit coupled to the output node and configured to provide a fixed reference voltage or a switching signal voltage depending on an operating mode of the comparator system.

This summary is intended to provide an overview of the present subject matter and is not intended to provide an exclusive or exhaustive explanation of the invention. The detailed description is included to provide further information.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

DETAILED DESCRIPTION

A test system can provide a voltage pulse stimulus to a device under test (DUT) at a specified time, and optionally can measure a response from the DUT. The test system can be configured to provide high fidelity output signal pulses over a relatively large output signal magnitude range to accommodate different types of devices under test.

In an example, a test system can include a pin driver architecture that can provide high fidelity stimulus signals with minimal overshoot or spiking of high frequency current signals, and can enhance pulse edge placement accuracy and signal bandwidth at high or low power operating levels. In an example, a test system can include one or more driver stages, such as can include a class A driver stage or a class AB driver stage, such as can be configured to provide a variety of pulse signals. The system can include control circuits to precisely control switching control voltage signals and switching current signals, and to control an operating mode and monitoring or measuring activity of a comparator.

In an example, multiple drivers or driver stages can be used to provide a test system that is configurable to test a variety of semiconductor devices with varying voltage and speed requirements. Furthermore, multiple drivers can be used to enhance or enable multiple signal level testing or "multiplexing" for physical layer testing. During physical layer testing, the multiple drivers can be switched concurrently to provide various different stimuli or drive signals to a DUT.

A test system can include a comparator circuit or comparator stage that is configured to receive high speed voltage or current response signals from a DUT. A comparator, generally, is a decision element that provides information about a relationship between at least two input signals. For example, a comparator can provide a digital output (e.g., a logic high or a logic low signal) that indicates a relationship between a signal from a DUT and a reference signal, such as a reference voltage signal. The comparator can include one or more gain stages, such as can be coupled in series, to yield a high gain response.

Systems and methods described herein provide, among other things, a multiple-mode or digitally-controlled comparator. The comparator can be configured for high speed or low power operations to accommodate different test parameters and thereby help reduce testing costs. That is, it can be desirable to provide a comparator system that consumes a minimum amount of power to help reduce costs associated with high volume part testing. Some examples herein include or show various comparators or comparator circuits in the context of a test system or ATE, however, other uses are also contemplated.

Figure 1:
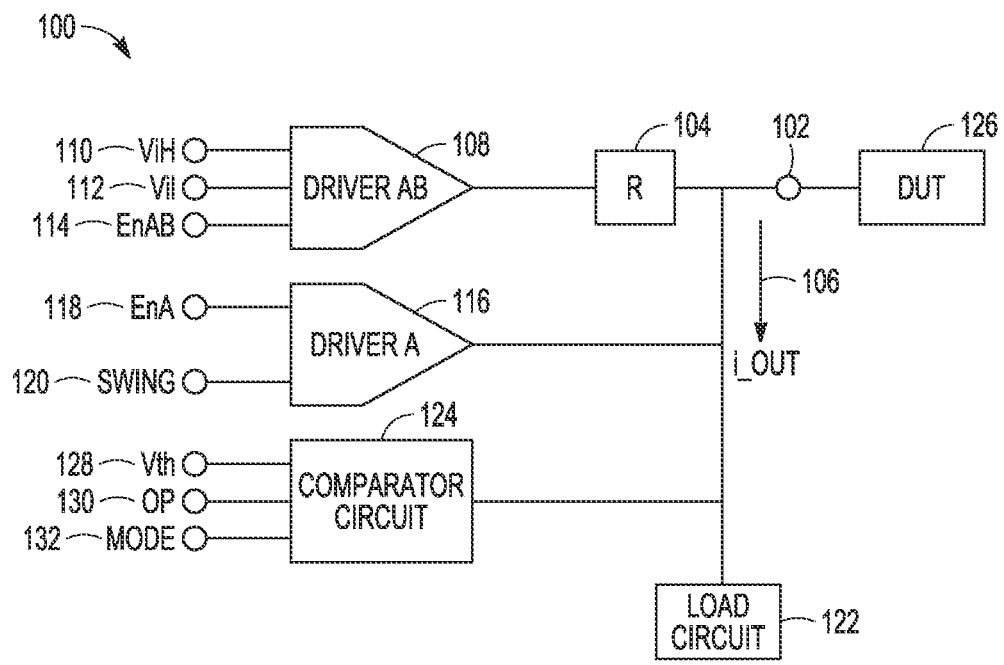
FIG. 1 illustrates generally an example of a test system topology including multiple driver circuits.

FIG. 1 illustrates generally a first example 100 of a test system topology including multiple driver stages and a comparator stage. The first example 100 includes a first DriverAB 108 that can include a class AB driver circuit, and a first DriverA 116 that can include a class A driver circuit.

The first example 100 can further include an output element such as a first resistor 104 that can be configured to provide a specified output or load impedance. In an example, the first example 100 can include a comparator circuit 124, or a first load circuit 122, such as can include an active load or other loading device. In an example, the test system is configured to provide a first output current 106, i_OUT, at a DUT pin 102.

In an example, the first DriverAB 108 can be configured to produce a voltage stimulus signal by selecting between parallel-connected diode bridges with each bridge driven by a unique, dedicated DC voltage level. In the first example 100 of FIG. 1, DC voltages Vih 110 and Vil 112 drive diode bridges in the first DriverAB 108. The switching stage can be followed by a voltage buffering stage that can provide power gain, such as can be used to produce large currents to serve a 50 ohm DUT environment.

In contrast with the first DriverAB 108, the first DriverA 116 can be configured to produce transitions at the DUT pin 102 using a relatively large current switch stage that can be coupled directly to the DUT pin 102. A current switching stage in the first DriverA 116 can alternately switch current into and out of the DUT pin 102 in response to a control signal Swing 120, such as can be a voltage control signal. The first DriverA 116 can provide high speed operation, for example, because it may be unburdened by the class AB voltage buffering stage with its attendant bandwidth limitations and other performance limitations.

In an example, the first DriverA 116 can be configured to provide a relatively low amplitude signal at the DUT pin 102. For example, the first DriverA 116 can provide a signal having about a 2 volt swing. The first DriverAB 108 can be configured to provide a relatively high amplitude signal at the DUT pin 102, for example, −1.5 to +7 volts. The first DriverA 116 generally, operates at a higher switching speed or bandwidth than the first DriverAB 108. In an example, the first DriverAB 108 can be configured to absorb switching currents from the first DriverA 116. That is, the first DriverAB 108 can serve as a buffer that the first DriverA 116 can source current into, such as through the first resistor 104.

One or both of the first DriverAB 108 and the first DriverA 116 can be selected to fulfill disparate DUT test requirements that may not otherwise be fulfilled by a single driver. For example, while both driver circuits can provide DUT waveforms, the first DriverAB 108 can be configured to provide large amplitude, low bandwidth stimulus signals, and the first DriverA 116 can be configured to provide low amplitude, high bandwidth stimulus signals.

In an example, the first DriverAB 108 and the first DriverA 116 do not share an enable pin. Instead, each driver circuit includes an independent enable control through pins EnAB 114 and EnA 118. The independent enable control facilitates the first DriverAB 108 to serve as a low speed, high voltage stimulus source, and to serve as a static, non-transitioning buffer to absorb switching currents from the first DriverA 116.

FIG. 1 includes the comparator circuit 124. The comparator circuit 124 can include a multiple-stage comparator that is configured to receive signals from the DUT 126, such as via the DUT pin 102. The comparator circuit 124 can compare the received signals to a comparator reference signal 128 and, in response, provide a differential comparator output signal 130. For example, the comparator circuit 124 can receive a voltage signal from the DUT 126 and compare an amplitude of the voltage signal to an amplitude of the comparator reference signal 128. The comparator circuit 124 can provide information about the amplitude relationship. For example, the differential comparator output signal 130 can include signals having substantially the same magnitude when the comparator reference signal 128 is equal to a signal received from the DUT 126.

In an example, the comparator circuit 124 can operate in different comparator modes. The comparator circuit 124 can include a comparator mode control node 132 configured to receive one or more signals that control or configure the comparator circuit 124 to operate in one of its available modes. For example, in response to a first control signal at the mode control node 132, the comparator circuit 124 can be configured in a first operating mode. In the first operating mode, the comparator circuit 124 can be configured for relatively low power operation, such as can be characterized in part as a mode in which the comparator circuit 124 consumes a minimum amount of current. In response to a different second control signal at the mode control node 132, the comparator circuit 124 can be configured in a second operating mode. In the second operating mode, the comparator circuit 124 can be configured for relatively high speed operation, such as can be characterized in part as a mode in which the comparator circuit 124 consumes relatively more current than in the first operating mode.

Figure 2:
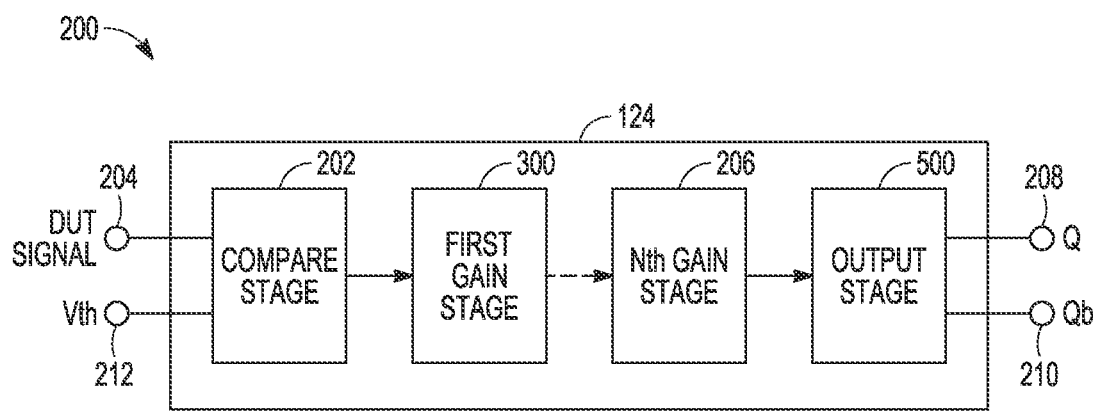
FIG. 2 illustrates generally an example of a comparator circuit.

FIG. 2 illustrates generally a comparator example 200 that can include the comparator circuit 124. The comparator circuit 124 can include a comparator input node 204, a reference signal input node 212, a first output node 208, and a second output node 210. The comparator circuit 124 can include multiple different circuit stages provided in series. For example, the comparator circuit 124 can include a compare stage 202, one or more gain stages, such as a first gain stage 300 through an nth gain stage 206, and an output stage 500.

In an example, the compare stage 202 can be configured to receive a stimulus or DUT signal from the DUT 126 using the comparator input node 204. The compare stage 202 can receive a voltage reference signal Vth using the reference signal input node 212. Generally, the compare stage 202 is configured to perform a signal comparison operation to determine which of the respective signals at the comparator input node 204 and the reference signal input node 212 has a greater or lesser signal amplitude characteristic, such as at a particular or specified time. A comparison result or output of the compare stage 202 can be provided to the first gain stage 300. In an example, the comparison result includes a differential signal or logic signal, that is, a signal having two signal components.

In an example, the compare stage 202 includes a differential amplifier that amplifies a differential voltage received at the comparator input node 204 and the reference signal input node 212, and suppresses common-mode signal components. Various other compare stage 202 circuits can be used, such as including one or more of the comparators described by McQuilkin in U.S. Pat. No. 9,813,050, titled "Comparator Circuit with Input Attenuator," which is hereby incorporated herein by reference in its entirety. The compare stage 202 decision circuit can include, among other things, a differential pair that reports when the DUT signal crosses the reference signal voltage Vth, but can also serve as a level shifter to allow the subsequent gain stages to operate below ground, such as to save power.

The first gain stage 300 can include various gain or amplifier circuitry. That is, the first gain stage 300 can include amplifier circuitry such as can include operational amplifiers or other arrangements or configurations of transistors or other circuitry to perform signal amplification or buffering. Multiple gain stage instances can be provided in series, such that each gain stage further amplifies or buffers an output of a preceding gain stage. In the example of FIG. 2, the first gain stage 300 provides a first gain stage output signal to one or more intermediate gain stages that, in turn, provide a gain stage output using a last or nth gain stage 206. The nth gain stage 206 can be configured to provide an output signal into a relatively high input impedance receiver in the output stage 500. In response, the output stage 500 can provide an output signal to a low impedance environment thus providing power gain. The various gain stages, such as the first gain stage 300, the nth gain stage 206, and any one or more intervening gain stages, can be identically or differently configured.

In an example, the output stage 500 provides the differential comparator output signal 130 that includes first and second signal components at the first output node 208 and second output node 210, respectively. That is, the comparator stage output signal components can be used to provide a digital output signal indicative of a magnitude relationship between the input signals received at the comparator input node 204 and the reference signal input node 212.

Figure 3:
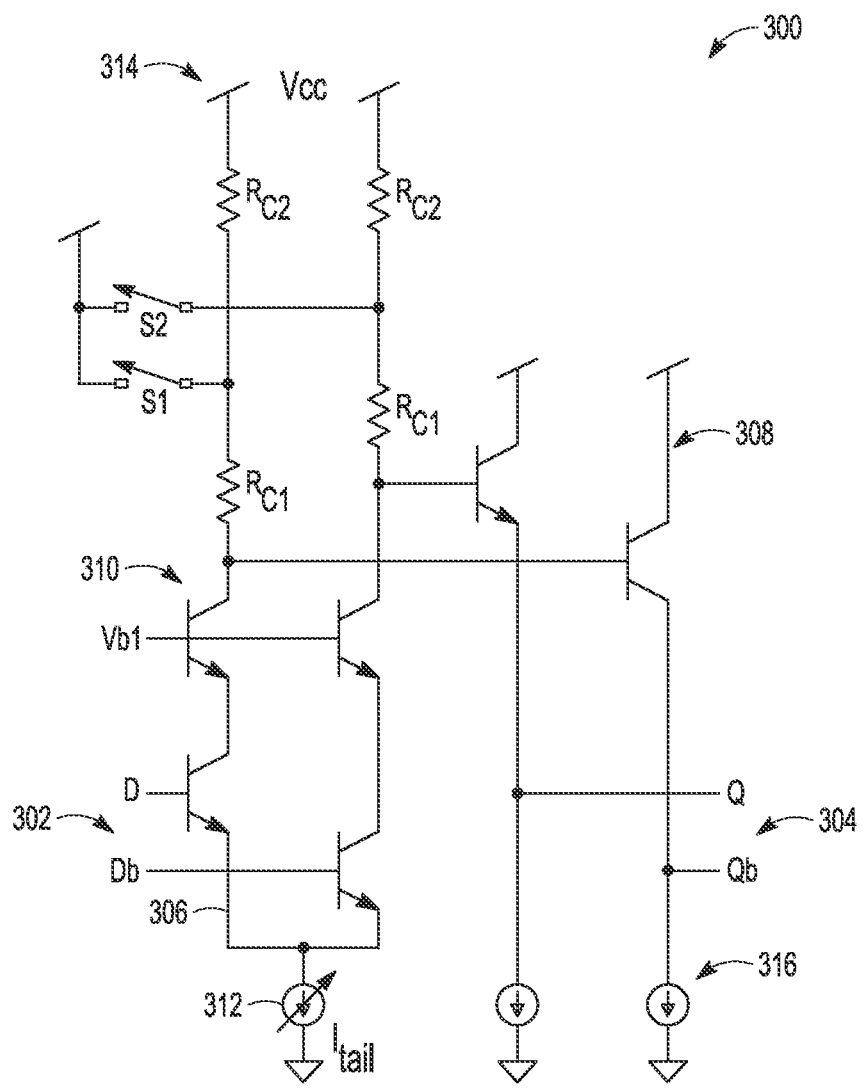
FIG. 3 illustrates generally a first example of a gain stage of a comparator circuit.

FIG. 3 illustrates generally an example of a gain stage topology, such as can comprise the first gain stage 300. The first gain stage 300 can be configured to receive a comparison result signal 302 from the compare stage 202. In an example, the comparison result signal 302 includes a differential voltage signal. The first gain stage 300 can receive the components of the comparison result signal 302 using respective first and second transistors of a first differential pair 306.

In FIG. 3, the first differential pair 306 can be coupled to a first current source 312. The first current source 312 can provide an adjustable current signal, Itail, to power the first differential pair 306. A magnitude of a current signal, Itail, provided by the first current source 312 can depend on an operating mode of the comparator circuit 124. For example, in a first operating mode corresponding to lower power consumption, the magnitude of Itail can be relatively smaller than in the second operating mode corresponding to higher speed operation.

The first differential pair 306 can be coupled to a bias network 310 and a gain stage output network 308 that, in turn, can be coupled to a pair of bias current sources 316. The gain stage output network 308 can be configured to provide a gain stage output signal 304. In an example, the first gain stage 300 is configured to provide a substantially constant gain to signals received at the input. That is, a gain characteristic of the first gain stage 300 can be substantially constant in the first and different second operating modes of the comparator circuit 124.

A gain characteristic of the first gain stage 300 can be determined in part by a magnitude of the current signal, Itail, provided by the first current source 312 and by an impedance at the collector terminals of the devices in the first differential pair 306. A gain, Av, of the first gain stage 300 can be expressed as Av=Itail*Rcollector/N, wherein Itail is a current provided by the first current source 312, N is a constant related to a type of elements used to construct the first differential pair 306, and Rcollector is a resistance at the collector of one of the transistors in the first differential pair 306. Gain can thus be increased by increasing a magnitude of the current Itail or increasing a magnitude of the resistance Rcollector.

In an example, bandwidth of the first gain stage 300 can be influenced or determined by the collector resistance Rcollector and parasitic capacitance at the collector terminal. Generally, bandwidth can be increased as the collector resistance Rcollector is reduced. Thus there can be a design tradeoff between bandwidth and gain.

In an example, the adjustable impedance circuit 314 is configured to change an impedance at the collector terminals of the devices in the first differential pair 306, to thereby influence or change a gain characteristic of the first gain stage 300. In an example, a magnitude of the current Itail provided by the first current source 312 is configured to change in correspondence with changes to the impedance provided by the adjustable impedance circuit 314.

In an example, the adjustable impedance circuit 314 includes a resistor network in each of the signal paths extending from the respective devices in the first differential pair 306. That is, the adjustable impedance circuit 314 can include one or more resistors coupled to a collector of the first transistor of the first differential pair 306 and can include one or more resistors coupled to a collector of the second transistor of the first differential pair 306. In the example of FIG. 3, a pair of series-coupled resistors Rc1 and Rc2 are coupled to each of the respective collectors of the devices in the first differential pair 306. The resistance values of the resistors Rc1 and Rc2 can be the same or different; for purposes of this discussion, the resistors can be assumed to have the same resistance value. Different values can be used to realize different gain characteristics, such as in the different operating modes.

The adjustable impedance circuit 314 can include switches S1 and S2 that control respective shunt paths for the collector resistors Rc2. Switches S1 and S2 can be configured to operate together, or concurrently, such that both switches are open or are closed at the same time. In an example, the switches S1 and S2 are operable in response to control signals presented at the mode control node 132.

When the switches S1 and S2 are open, such as in the first operating mode, an effective collector resistance for each of the transistors in the first differential pair 306 is Rc1+Rc2. To ensure a specified, target gain is achieved through the first gain stage 300 in the first operating mode, a magnitude of the tail current, Itail, can be decreased, such as to compensate for the greater collector resistance. In an example, when the switches S1 and S2 are closed, such as in the second operating mode, the effective collector resistance for each of the transistors in the first differential pair 306 is Rc1. To maintain substantially the same target gain through the first gain stage 300 in the second operating mode as in the first operating mode, the magnitude of the tail current Itail can be increased.

The first gain stage 300 can thus be configured to provide substantially the same amount of gain in the first operating mode and in the second operating mode. The first operating mode can be characterized in part by lower power consumption by the first gain stage 300 (e.g., less tail current Itail from the first current source 312) and, consequentially, lower bandwidth or relatively slower performance relative to the second operating mode. The second operating mode can be characterized in part by higher bandwidth or relatively faster performance by the first gain stage 300 and, consequentially, higher power consumption relative to the first operating mode (e.g., more tail current Itail from the first current source 312). In other words, in the first operating mode, the switches S1 and S2 can be open to thereby present a relatively higher impedance at the collectors of the devices in the first differential pair 306 and, to ensure a desired gain characteristic is met, the tail current, Itail, can be reduced. In the second operating mode, the switches S1 and S2 can be closed to present a relatively lesser impedance at the collectors of the devices in the first differential pair 306 and, to ensure the same desired gain characteristic is met, the tail current, Itail, can be increased. In this manner, the same first gain stage 300 can be useful in both low power and high bandwidth applications.

Figure 4:
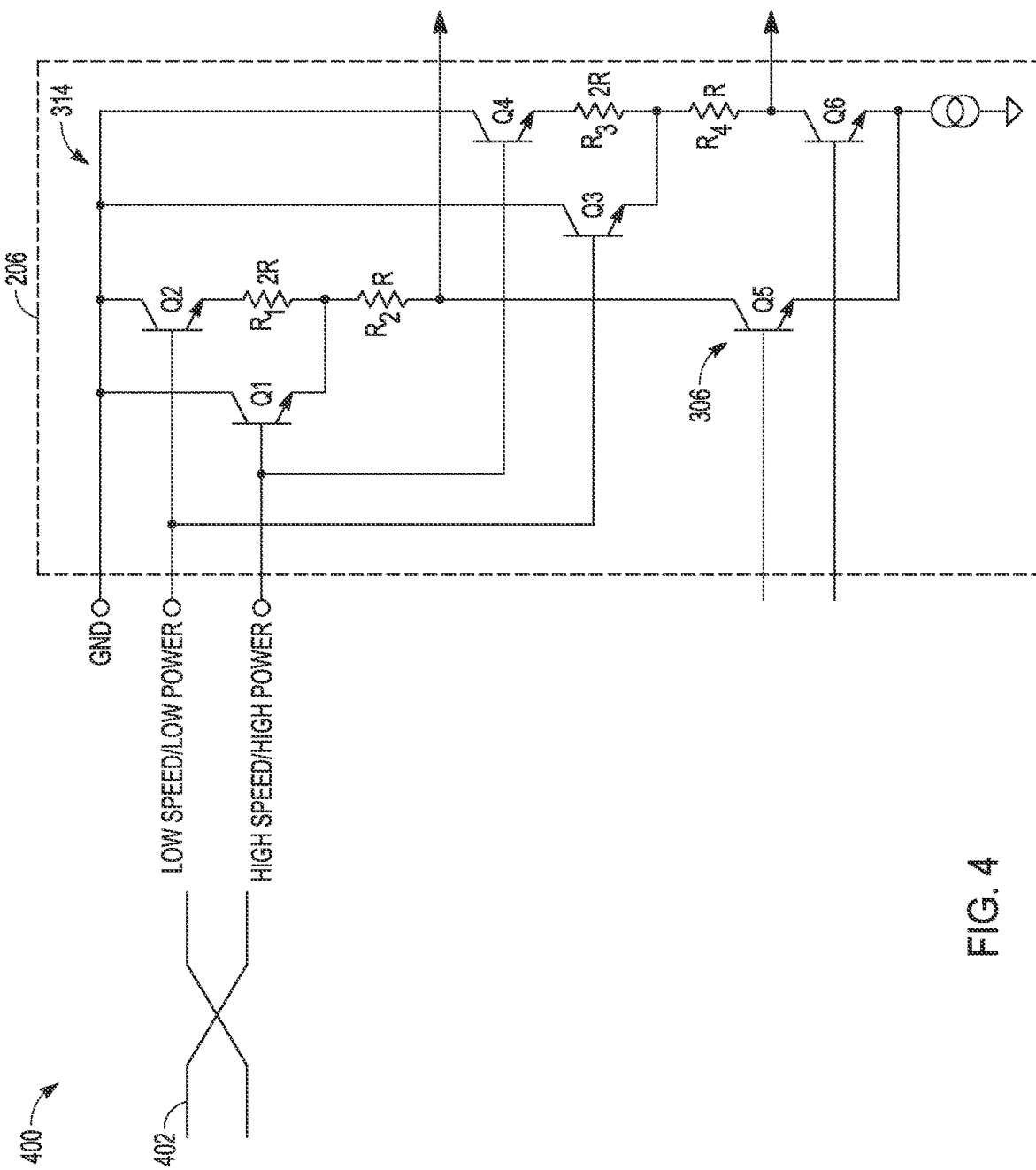
FIG. 4 illustrates generally a second example of a gain stage of a comparator circuit.

FIG. 4 illustrates generally an example of a gain stage detail 400. In an example, the gain stage detail 400 comprises a portion of the first gain stage 300 or the nth gain stage 206. That is, one or more of the first gain stage 300, the nth gain stage 206, or one or more intermediate and unillustrated gain stages, can include or use the topology illustrated in the gain stage detail 400.

In the example of FIG. 4, Q5 and Q6 comprise devices of the first differential pair 306 with bases coupled to respective gain stage input nodes. In an example, to maintain constant voltage swings at an output of the gain stage, the resistive loading at the collectors of Q5 and Q6 can change according to an operating mode of the comparator circuit 124. For example, the adjustable impedance circuit 314 can include various segments comprising at least two series loads or resistors and a control mechanism or switch to determine which portion of the loads is used to conduct the Q5 or Q6 switching collector current. In the example of FIG. 4, the control mechanism comprises switches, or transistors Q1, Q2, Q3, and Q4, with base voltages controlled by a mode control signal 402. In an example, the mode control signal 402 comprises a pair of complementary control signals wherein one side is high when the other is low. In an example, the mode control signal 402 can be received by the mode control node 132 of the comparator circuit 124.

In the first operating mode, a base voltage at transistor Q2 can be high and a base voltage at transistor Q1 can be low. As a result, transistor Q1 can turn off and, in turn, transistor Q2 can conduct the switching current from the first differential pair 306 through a total resistance of 3 R. In the second operating mode, the base voltage at transistor Q1 can be high and the base voltage at transistor Q2 can be low, thus turning off transistor Q2 and leaving Q1 to conduct the switching current through a total resistance of 1 R. That is, in the second operating mode, the adjustable impedance circuit 314 loads the collectors of the first differential pair 306 devices with a lesser resistance than in the first operating mode.

In an example, one or more of the gain stages in the comparator circuit 124 can be configured as a pass-through or buffer stage. For example, a switching voltage at the output of the nth gain stage 206 can remain substantially constant in the first and second operating modes despite a reduction in collector resistance, for example, because a magnitude of the tail current, Itail, provided by the first current source 312 can be adjusted for each mode.

In an example, in the first or lower power operating mode, a base voltage at transistor Q2 can be high and a base voltage at transistor Q1 can be low. A voltage at the emitter of transistor Q1 can then be maintained at a substantially high enough reverse bias voltage magnitude such that transistor Q1 is reverse biased and unable to conduct. Furthermore, a parasitic capacitance at the emitter of transistor Q1 can be minimized, for example, by ensuring that the base of transistor Q1 is driven as low as possible since emitter capacitance is inversely proportional to reverse bias voltage. It can be important to minimize capacitance at the emitter of transistor Q1 since such capacitance can serve as a high speed current shunt across the resistor r1, which can lead to waveform discontinuities, poor fidelity, and compromised timing accuracy. Alternative switching methods used to adjust collector load resistance, such as MOS transistors or transmission gates, can exhibit larger capacitance and can result in diminished circuit performance.

In an example, the collector switching pairs, or bipolar transistor pairs (e.g., transistors Q1 and Q2, or transistors Q3 and Q4), can provide substantially, similar functionality as a switch connected between ground and the node coupling the series resistors. In the first operating mode, the FET could be opened so as to not conduct current, and in the second operating mode, the FET could be closed to conduct current. The illustrated bipolar switching pair approach affords various advantages, however. For example, since a bipolar transistor's transconductance, gm, can be very large, a bipolar device can produce a small impedance at the resistor junction node using a physically small, low capacitance device. Low impedance can be important because the node is in series with the collector load resistor, and impedance changes over temperature and process can be undesirable. A large percentage change of a small switching resistance can produce a small overall collector load resistance error and thus a small voltage error. A FET large enough to provide an impedance as small as the bipolar transistor would be physically large and would capacitively load the resistor junction node.

Figure 5:
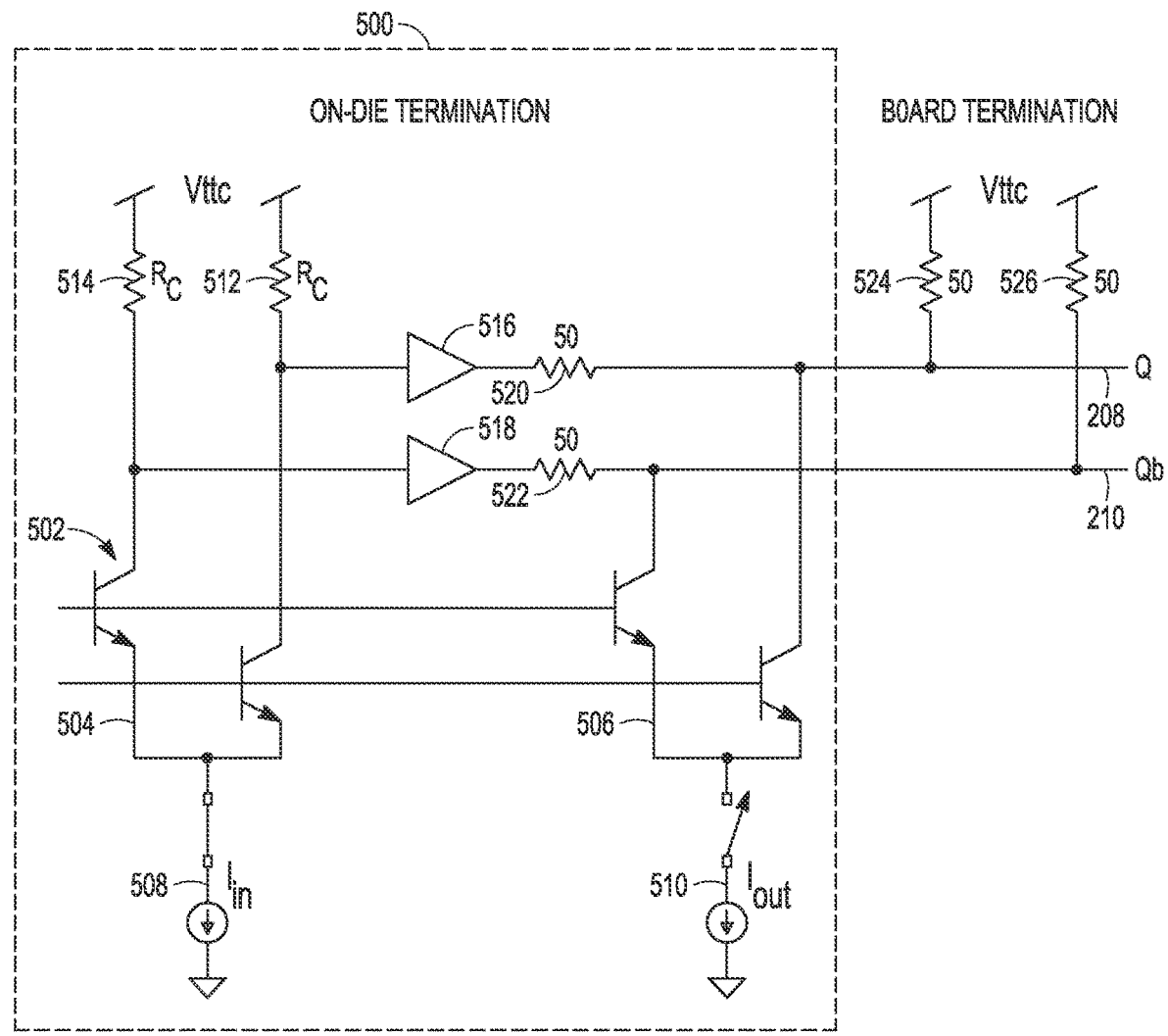
FIG. 5 illustrates generally an example of an output stage of a comparator circuit.

FIG. 5 illustrates generally an example of the output stage 500. In the example of FIG. 5, the output stage 500 is coupled to termination devices, such as can be provided by transmission lines, using the first output node 208 and the second output node 210. For example, the output stage 500 can be coupled to termination devices including a first termination resistor 524 and a second termination resistor 526 that can provide a matching impedance for transmission lines. In practice, the first termination resistor 524 and second termination resistor 526 can be relatively low resistance devices since practical transmission lines can have relatively low impedance characteristics. The output stage 500 can thus be used to provide power gain from a high impedance environment in a preceding stage, such as a gain stage or the nth gain stage 206, to a low impedance environment that can include transmission lines, the first termination resistor 524, or the second termination resistor 526.

In an example, the output stage 500 is configured to receive an output stage input signal 502. The output stage input signal 502 can include a gain stage output signal such as from the nth gain stage 206. In an example, the output stage 500 includes a second differential pair 504 and a third differential pair 506 coupled in parallel, and each of the second differential pair 504 and the third differential pair 506 can be configured to receive the same output stage input signal 502. In the example of FIG. 5, the second differential pair 504 and the third differential pair 506 can be configured to operate mutually exclusively, For example, the second differential pair 504 can be coupled to a second current source 508, and the third differential pair 506 can be coupled to a third current source 510. The respective switches coupling the differential pairs to their respective current sources can be configured to operate such that one switch is open while the other is closed.

In the first operating mode of the comparator circuit 124, such as can be characterized in part as consuming relatively less power than the higher bandwidth second operating mode of the comparator circuit 124, the second differential pair 504 can be configured to receive the output stage input signal 502 and, in response, conduct a current Iin from the second current source 508. In the first operating mode, the third current source 510 can be decoupled from the third differential pair 506, thereby effectively turning off or disabling the third differential pair 506 and preventing the devices in the third differential pair 506 from conducting. Information about the output stage input signal 502 can then be provided through the second differential pair 504 to input terminals of a first buffer circuit 516 and a second buffer circuit 518. In response, the first buffer circuit 516 and the second buffer circuit 518 can provide output signals at the first output node 208 and the second output node 210 of the output stage 500. In an example, the outputs of the first buffer circuit 516 and the second buffer circuit 518 are respectively coupled to a first termination resistor 520 and a second termination resistor 522, which are in turn respectively connected to the first output node 208 and the second output node 210. In an example, the first termination resistor 520 and second termination resistor 522 can be integrated with the comparator circuit 124, that is, provided on the same ATE test head as the comparator circuit 124.

In the second operating mode of the comparator circuit 124, such as can be characterized in part as accommodating higher bandwidth signals than in the lower power first operating mode of the comparator circuit 124, the third differential pair 506 can be configured to receive the output stage input signal 502 and, in response, conduct a current Iout from the third current source 510. In the second operating mode, the second current source 508 can be decoupled from the second differential pair 504, thereby effectively turning off or disabling the second differential pair 504 and preventing the devices in the second differential pair 504 from conducting. Information about the output stage input signal 502 can then be provided through the third differential pair 506 to the first output node 208 and the second output node 210 of the output stage 500. With the second differential pair 504 disabled, the first collector resistor 512 and the second collector resistor 514, which are coupled to a voltage supply rail Vttc, provide respective bias voltage signals at the inputs of the first buffer circuit 516 and the second buffer circuit 518. The collector resistors associated with the second differential pair 504 can thus provide a gain tuning effect in the first operating mode and, in the second operating mode, can be used to provide a bias voltage signal. That is, in the second operating mode, the third differential pair 506 switches an output signal directly at the output nodes, and the first buffer circuit 516 and the second buffer circuit 518 provide a reference voltage for the output signal.

Figure 6:
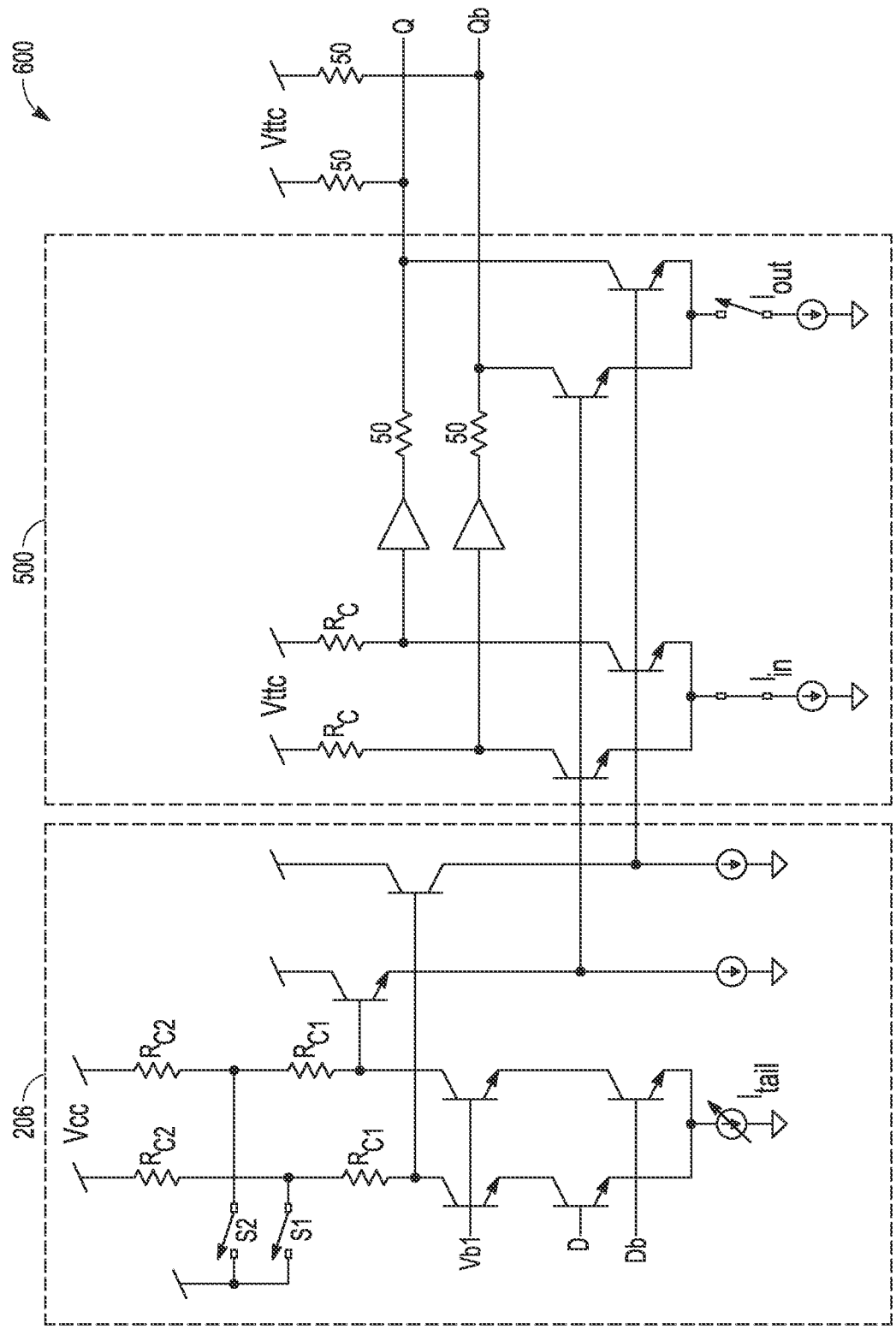
FIG. 6 illustrates generally a comparator topology in a first, lower-power operating mode.

FIG. 6 illustrates generally a first operating mode example 600 of the comparator circuit 124. The first operating mode example 600 includes an example of the nth gain stage 206 in the first operating mode wherein the switches S1 and S2 are open. The resistive load presented to the collectors of the devices in the first differential pair 306 is thus relatively high, and a magnitude of the adjustable tail current, Itail, from the first current source 312 can be minimized. In the example of FIG. 6, an output of the nth gain stage 206 is coupled to an input of the output stage 500. The output stage 500 receives the output from the nth gain stage 206 and provides a switched signal, via the second differential pair 504, to the first buffer circuit 516 and the second buffer circuit 518. In the first operating mode example 600, the third differential pair 506 can be off. In response to the input signals at their respective inputs, the first buffer circuit 516 and second buffer circuit 518 provide a differential switched output signal that indicates a relationship between a DUT signal, such as received from the DUI pin 102, and a reference voltage signal, Vth, or the comparator reference signal 128.

Figure 7:
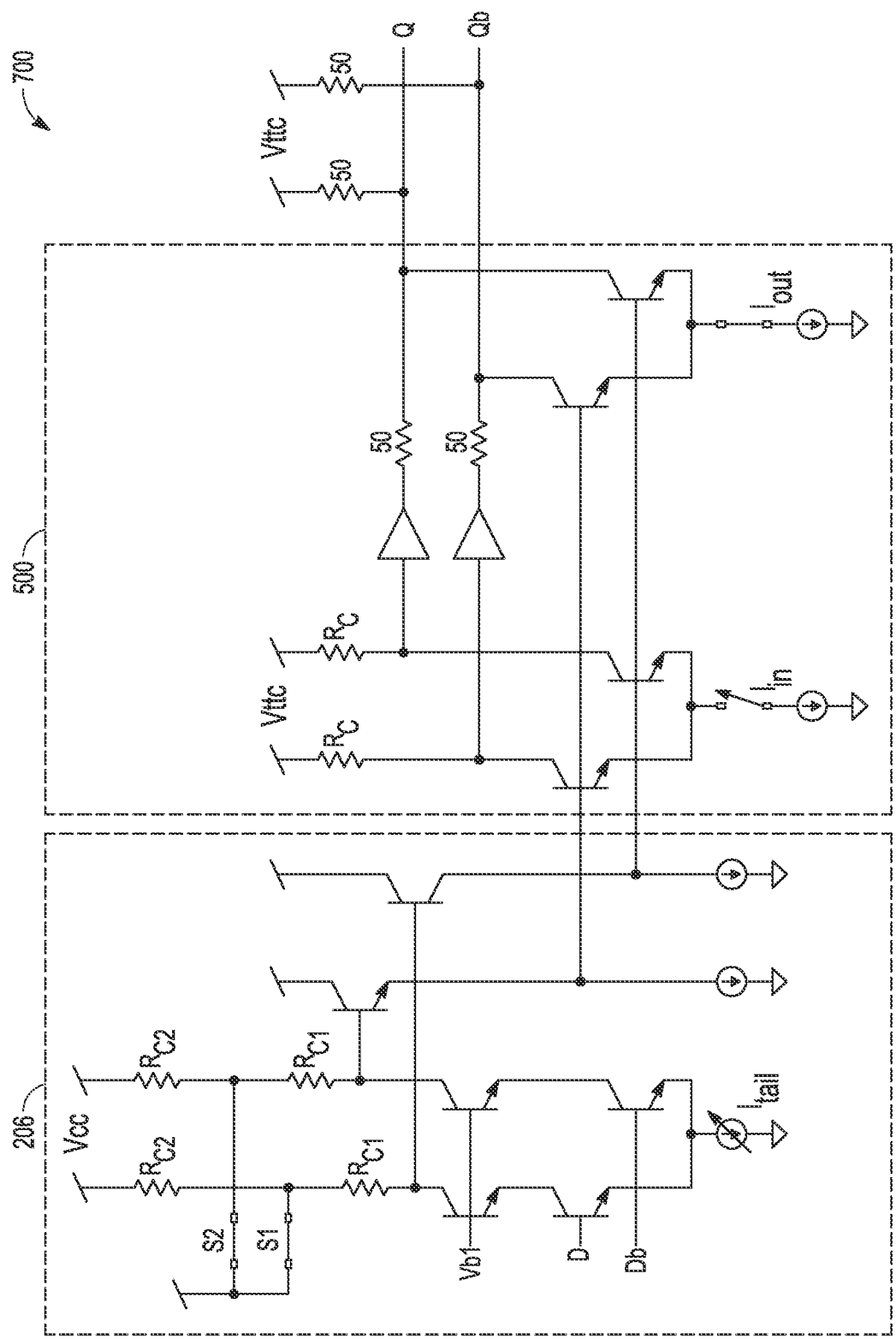
FIG. 7 illustrates generally a comparator topology in a second, higher-speed operating mode.

FIG. 7 illustrates generally a second operating mode example 700 of the comparator circuit 124. The second operating mode example 700 includes an example of the nth gain stage 206 in the second operating mode wherein the switches S1 and S2 are closed. The resistive load presented to the collectors of the devices in the first differential pair 306 is thus relatively low and a magnitude of the adjustable tail current, Itail, from the first current source 312 can be increased relative to the magnitude used in the first operating mode, such as to maintain constant gain in the first and second operating modes.

In the example of FIG. 7, an output of the nth gain stage 206 is coupled to an input of the output stage 500. The output stage 500 receives the output from the nth gain stage 206 and provides a switched signal, via the third differential pair 506, to the output nodes of the output stage 500. In the second operating mode example 700, the second differential pair 504 can be off. In this second operating mode example 700, the first buffer circuit 516 and second buffer circuit 518 can provide a fixed reference voltage signal at the same output nodes of the output stage 500. The output nodes can thus provide a differential switched output signal that indicates a relationship between a DUT signal, such as received from the DUT pin 102, and a reference voltage signal, Vth, or the comparator reference signal 128.

Various aspects of the present disclosure can help provide a solution to the test system-related problems identified herein.

In an example, Aspect 1 can include or use subject matter such as an apparatus, a system, or a device, that can include or use a comparator circuit, such as for use in automated test equipment. In an example, Aspect 1 can include a multi-mode comparator system operable in a lower power first mode or a higher speed second mode. In Aspect 1, the comparator system can include a gain circuit including an input switching stage coupled to an adjustable impedance device, wherein an impedance magnitude of the impedance device influences a bandwidth characteristic of the gain circuit, and wherein the gain circuit is configured to provide a gain stage output signal. Aspect 1 can include an output stage configured to receive the gain stage output signal and provide a drive signal at an output node, the output stage including a buffer circuit coupled to the output node and configured to provide a fixed reference voltage or a switching signal voltage depending on an operating mode of the comparator system.

Aspect 2 can include or use, or can optionally be combined with the subject matter of Aspect 1, to optionally include or use a termination resistor between the output node and the buffer circuit, wherein in a lower power first mode, a first switching device is configured to switch a first lesser current to provide a switched buffer input signal to the buffer circuit and, in response, the buffer circuit is configured to provide the drive signal to the termination resistor, and wherein in a higher speed second mode, the buffer circuit is configured to provide the fixed reference voltage at a first side of the termination resistor, and a second switching device is configured to switch a second greater current at a second side of the termination resistor to provide the drive signal at the output node.

Aspect 3 can include or use, or can optionally be combined with the subject matter of Aspect 2, to optionally include or use a first current source configured to provide the first lesser current, and a different second current source configured to provide the second greater current.

Aspect 4 can include or use, or can optionally be combined with the subject matter of Aspect 2, to optionally include or use the first switching device including a first differential pair configured to receive the gain stage output signal, and the second switching device including a second differential pair configured to receive the same gain stage output signal.

Aspect 5 can include or use, or can optionally be combined with the subject matter of Aspect 4, to optionally include or use first and second resistors coupled to respective collector terminals of the first differential pair and to a voltage supply rail. In Aspect 5, the buffer circuit can include a pair of buffer input channels, and each of the buffer input channels can be coupled to a respective one of the collector terminals of the first differential pair.

Aspect 6 can include or use, or can optionally be combined with the subject matter of one or any combination of Aspects 1 through 5 to optionally include or use the output stage including first and second differential pairs configured to operate mutually exclusively in two different operating modes of the comparator system.

Aspect 7 can include or use, or can optionally be combined with the subject matter of one or any combination of Aspects 1 through 6 to optionally include or use the input switching stage of the gain circuit including a first differential pair including first and second transistors and an adjustable impedance network coupled to collector terminals of the transistors.

Aspect 8 can include or use, or can optionally be combined with the subject matter of Aspect 7, to optionally include, in a higher speed first mode of the comparator system, the impedance network providing a lesser first impedance at the collector terminals of the transistors, and in a lower power second mode of the comparator system, the impedance network providing a greater second impedance at the collector terminals of the transistors.

Aspect 9 can include or use, or can optionally be combined with the subject matter of Aspect 7, to optionally include or use an adjustable tail current source coupled to the first and second transistors, wherein the adjustable tail current source is configured to provide a greater magnitude current signal in a higher speed first mode of the comparator system, and the adjustable tail current source is configured to provide a lesser magnitude current signal in a lower power second mode of the comparator system.

Aspect 10 can include or use, or can optionally be combined with the subject matter of one or any combination of Aspects 1 through 9 to optionally include or use a compare stage circuit configured to receive a signal from a device under test and a reference signal and, in response, provide a comparison output to the input switching stage of a first one of multiple series-coupled instances of the gain circuit.

Aspect 11 can include or use, or can optionally be combined with the subject matter of one or any combination of Aspects 1 through 10 to optionally include or use the gain circuit configured to provide substantially the same gain independent of a selected operating mode of the comparator system.

Aspect 12 can include or use subject matter such as an apparatus, a system, or a device, that can include or use a multiple operating-mode comparator system for high and low bandwidth automated test systems. Aspect 12 can include, for example, a gain stage configured to drive a high impedance input of a comparator output stage, wherein the gain stage includes a differential switching stage coupled to an adjustable impedance circuit, and wherein an impedance magnitude characteristic of the adjustable impedance circuit corresponds to a bandwidth characteristic of the gain stage. In Aspect 12, the comparator output stage can include a buffer circuit coupled to a low impedance comparator output node, wherein the buffer circuit is configured to provide a reference voltage for a switched output signal at the output node in a higher speed mode, and the buffer circuit is configured to provide the switched output signal at the output node in a lower power mode.

Aspect 13 can include or use, or can optionally be combined with the subject matter of Aspect 12, to optionally include or use the comparator output stage including first and second differential pairs configured to operate mutually exclusively in the higher speed mode and the lower power mode in response to a drive signal from the gain stage, wherein output terminals of the first differential pair are coupled to an input path of the buffer circuit, and wherein output terminals of the second differential pair are coupled to an output path of the buffer circuit.

Aspect 14 can include or use, or can optionally be combined with the subject matter of Aspect 13, to optionally include or use the first and second differential pairs coupled to respective current sources that provide current signals having different magnitude characteristics.

Aspect 15 can include or use, or can optionally be combined with the subject matter of Aspect 13, to optionally include or use a termination resistor in the output path between an output terminal of the second differential pair and a system output node.

Aspect 16 can include or use, or can optionally be combined with the subject matter of one or any combination of Aspects 12 through 15 to optionally include or use the adjustable impedance circuit including a resistor network coupled to output terminals of the differential switching stage, and a shunt circuit configured to shunt one or more resistors in the resistor network in the higher speed mode and not shunt the one or more resistors in the lower power mode.

Aspect 17 can include or use subject matter such as an apparatus, a system, or a device, that can include or use a multiple operating-mode comparator system for high and low bandwidth automated test systems. For example, Aspect 17 can include a comparator system operable in a higher speed first mode and a lower power second mode, such as including an adjustable-power gain stage and an output stage. In Aspect 17, the adjustable-power gain stage can be configured to receive a differential input signal and, in response, provide a gain stage output signal, wherein a gain characteristic of the gain stage is substantially constant in the higher speed first mode and the lower power second mode. In Aspect 17, the output stage can include a buffer circuit coupled to a buffer input switch and a buffer output switch, the output stage having a high impedance input configured to receive the gain stage output signal and a low impedance output configured to provide a switched output signal at an output node. In the example of Aspect 17, such as in the higher speed first mode, the buffer input switch is open, the buffer output switch is closed, and the buffer output switch provides the switched output signal at the output node. In the example of Aspect 17, such as in the lower power second mode, the buffer output switch is open, the buffer input switch is closed, and the buffer input switch provides a switching voltage at an input of the buffer circuit and the buffer circuit provides the switched output signal at the output node.

Aspect 18 can include or use, or can optionally be combined with the subject matter of Aspect 17, to optionally include, in the higher speed first mode, the buffer circuit is configured to provide a fixed reference voltage at the output node.

Aspect 19 can include or use, or can optionally be combined with the subject matter of Aspect 17 or Aspect 18, to optionally include the buffer input switch and the buffer output switch comprising respective differential pair circuits coupled to respective first and second current sources, and the first and second current sources are configured to provide current signals having different magnitude characteristics.

Aspect 20 can include or use, or can optionally be combined with the subject matter of one or a combination of Aspects 17 through 19, to optionally include the adjustable-power gain stage including a resistive network and a shunt circuit configured to shunt one or more resistors in the resistive network in the higher speed first mode.

Each of these non-limiting Aspects can stand on its own, or can be combined in various permutations or combinations with one or more of the other Aspects, examples, or features discussed elsewhere herein.

This detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. The present inventors contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more," In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein."

In the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods or circuit operations or circuit configuration instructions as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A comparator system operable in a higher speed first mode and a lower power second mode, the comparator system comprising:
    an adjustable-power gain stage configured to receive a differential input signal and, in response, provide a gain stage output signal, wherein a gain characteristic of the gain stage is substantially constant in the higher speed first mode and the lower power second mode; and
    an output stage including a buffer circuit coupled to a buffer input switch and a buffer output switch, the output stage having a high impedance input configured to receive the gain stage output signal and a low impedance output configured to provide a switched output signal at an output node, wherein:
    in the higher speed first mode, the buffer input switch is open, the buffer output switch is closed, and the buffer output switch provides the switched output signal at the output node; and
    in the lower power second mode, the buffer output switch is open, the buffer input switch is closed, and the buffer input switch provides a switching voltage at an input of the buffer circuit and the buffer circuit provides the switched output signal at the output node.

2. The comparator system of claim 1, wherein in the higher speed first mode, the buffer circuit is configured to provide a fixed reference voltage at the output node.

3. The comparator system of claim 2, further comprising a termination resistor between the output node and the buffer circuit;
    wherein in the higher speed first mode, the buffer circuit is configured to provide the fixed reference voltage at a first side of the termination resistor, and the buffer output switch is configured to switch a first current at a second side of the termination resistor to provide the switched output signal; and
    wherein in the lower power second mode, the buffer input switch is configured to switch a second current to provide the switching voltage at the input of the buffer circuit and, in response, the buffer circuit is configured to provide a drive signal to the termination resistor.

4. The comparator system of claim 1, wherein the buffer input switch comprises a first differential pair circuit, the buffer output switch comprises a second differential pair circuit, and wherein inputs to the first and second differential pair circuits are coupled in parallel to receive the gain stage output signal.

5. The comparator system of claim 1, wherein the buffer input switch and the buffer output switch comprise respective differential pair circuits coupled to respective first and second current sources, and wherein the first and second current sources are configured to provide current signals having different magnitude characteristics.

6. The comparator system of claim 1, wherein the adjustable-power gain stage comprises a resistive network and a shunt circuit configured to shunt one or more resistors in the resistive network in the higher speed first mode.

7. The comparator system of claim 1, wherein the adjustable-power gain stage includes a differential input switching stage coupled to an adjustable impedance device.

8. The comparator system of claim 7, wherein an impedance magnitude of the adjustable impedance device is configured to influence a bandwidth characteristic of the gain stage.

9. A comparator circuit comprising:
    an output stage including a buffer circuit coupled to a buffer input switch and a buffer output switch, the output stage having a high impedance input configured to receive an input signal and a low impedance output configured to provide a switched output signal at an output node, wherein:
    in a first mode, the buffer input switch is open, the buffer output switch is closed, and the buffer output switch provides the switched output signal at the output node; and
    in a second mode, the buffer input switch is closed, the buffer output switch is open, and the buffer input switch provides a switching voltage at an input of the buffer circuit and the buffer circuit provides the switched output signal at the output node.

10. The comparator circuit of claim 9, wherein the buffer circuit is configured to provide a fixed reference voltage at the output node in the first mode, and the buffer circuit is configured to provide the switched output signal in the second mode.

11. The comparator circuit of claim 10, further comprising a termination resistor coupled between an output of the buffer circuit and the output node.

12. The comparator circuit of claim 9, wherein the buffer input switch comprises a first differential pair circuit, the buffer output switch comprises a second differential pair circuit, and wherein inputs to the first and second differential pair circuits are coupled in parallel.

13. The comparator circuit of claim 9, wherein the buffer input switch and the buffer output switch comprise respective differential pair circuits coupled to respective first and second current sources, and wherein the first and second current sources are configured to provide current signals having different magnitude characteristics.

14. The comparator circuit of claim 9, further comprising a gain stage configured to provide the input signal to the output stage, wherein the gain stage is configured to provide a constant gain in the first and second modes.

15. The comparator circuit of claim 14, wherein the gain stage comprises a differential input circuit and an adjustable impedance circuit, wherein the adjustable impedance circuit is configured to load the differential input circuit with a greater resistance in the first mode than in the second mode.

\* \* \* \* \*